United States Patent [19]

Romillon

[11] Patent Number: 5,777,833
[45] Date of Patent: Jul. 7, 1998

[54] ELECTRONIC RELAY FOR CALCULATING THE POWER OF A MULTIPHASE ELECTRIC LOAD BASED ON A RECTIFIED WAVE SIGNAL AND A PHASE CURRENT

[75] Inventor: Jean-Marc Romillon, Longnes, France

[73] Assignee: Schneider Electric SA, Boulogne Billancourt, France

[21] Appl. No.: 789,181

[22] Filed: Jan. 24, 1997

[30] Foreign Application Priority Data

Feb. 2, 1996 [FR] France .................... 96 01466

[51] Int. Cl.$^6$ .................................................. H02H 5/04
[52] U.S. Cl. .................... 361/30; 361/79; 361/187; 318/729; 364/483
[58] Field of Search .................... 361/23–31, 78, 361/79, 83, 85–87, 93–94, 187; 363/50, 74, 76; 318/729; 364/483, 492

[56] References Cited

U.S. PATENT DOCUMENTS

| | | | |
|---|---|---|---|
| Re. 33,874 | 4/1992 | Miller | 361/79 |
| 4,300,182 | 11/1981 | Schweitzer, III | 361/79 |
| 4,335,437 | 6/1982 | Wilson et al. | 364/483 |
| 4,400,655 | 8/1983 | Curtiss et al. | 318/729 |
| 4,703,387 | 10/1987 | Miller | 361/79 |
| 4,864,287 | 9/1989 | Kierstead | 340/648 |

FOREIGN PATENT DOCUMENTS

| | | |
|---|---|---|
| 2 663 473 | 12/1991 | France . |
| 39 00 179 A | 7/1990 | Germany . |
| 42 30 703 A | 3/1993 | Germany . |

*Primary Examiner*—Jeffrey A. Gaffin
*Assistant Examiner*—Michael J. Sherry
*Attorney, Agent, or Firm*—Oblon, Spivak, McClelland, Maier & Neustadt, P.C.

[57] ABSTRACT

An electronic relay having a current sensor device (C1, C2, C3), logic inputs (3) and an electronic circuit (4) provided with processing means capable of calculating, from the current signal (I) supplied by the current sensor device and a rectified voltage signal (V) supplied by one of the logic inputs, the value of the power factor of the motor (cos$\phi$) and/or the value of the power supply voltage (U) of the motor.

7 Claims, 1 Drawing Sheet

ELECTRONIC RELAY FOR CALCULATING THE POWER OF A MULTIPHASE ELECTRIC LOAD BASED ON A RECTIFIED WAVE SIGNAL AND A PHASE CURRENT

BACKGROUND OF THE INVENTION

1. Field of the Invention

This invention relates to an electronic protective relay for a multiphase electric load.

2. Discussion of the Background

With an electronic relay, it is possible to protect multiphase motors by cutting off their power supply for example when a current overload arises on at least one phase of the motor or an imbalance between the phase currents occurs. This type of relay includes, for each phase of the load, a current sensor device such as a current transformer that supplies an image signal of the current intensity in the phase. It also includes an electronic processing circuit which receives and processes the signals supplied by the sensor devices in order to supply a drive signal. Furthermore, the relay may include logic inputs which are used to produce command functions for the motor, such as the stop/go function or to carry out the resetting of the relay.

It is sometimes necessary to check the power supply voltage to the motor so as to detect brownouts in the supply. It is also necessary to check the power factor of the motor, commonly called cosφ, where φ is the angle between the voltage and the current of the motor so as to detect no-load operation of the motor. Furthermore, the values of the current, the power supply voltage to the motor and the power factor are necessary to calculate the power consumption of the motor.

The angle φ between the voltage and the current of the motor is assessed by comparing the current signal in one phase of the motor supplied via a current transformer with the voltage signal of the motor supplied by a voltage sensor of the voltage transformer type. This method of calculation has the disadvantage of needing specific means to implement it since it is necessary to add voltage transformers and to provide extra internal connections in the relay.

SUMMARY OF THE INVENTION

Consequently, the invention aims, in a simple manner and at low cost, to calculate the power factor of the motor and the power supply voltage to the motor from known means required to carry out the protective function of the relay without needing to add on specific means.

To this end, the subject of the invention is an electronic protective relay for a multiphase electric load such as a motor that includes one sensor device per phase to supply a signal that depends on the intensity of the phase current, logic inputs receiving external signals and an electronic microcontroller circuit provided to process the signals supplied, on the one hand by the sensor devices and, on the other hand by the logic inputs, characterised in that a voltage signal, an image of the supply voltage to the motor, is applied to one of the logic inputs linked to a circuit supplying a rectified voltage signal and that the electronic circuit includes processing means to calculate, from the current signal supplied by the current sensor device and characteristics linked to the period of the rectified voltage signal supplied by the circuit associated with the logic input, the value of the power factor of the motor and/or the value of the power supply voltage to the motor.

According to one characteristic, the processing means of the electronic circuit notably assesses the period of the rectified voltage signal and the time during which the rectified voltage signal has a minimum voltage condition in order to calculate the phase shift between the current and the voltage. The phase shift is compared, advantageously, with a table of values inside the electronic circuit and which defines a correlation between phase shift values and the associated cosine values.

DESCRIPTION OF THE PREFERRED EMBODIMENTS

Figure 1:
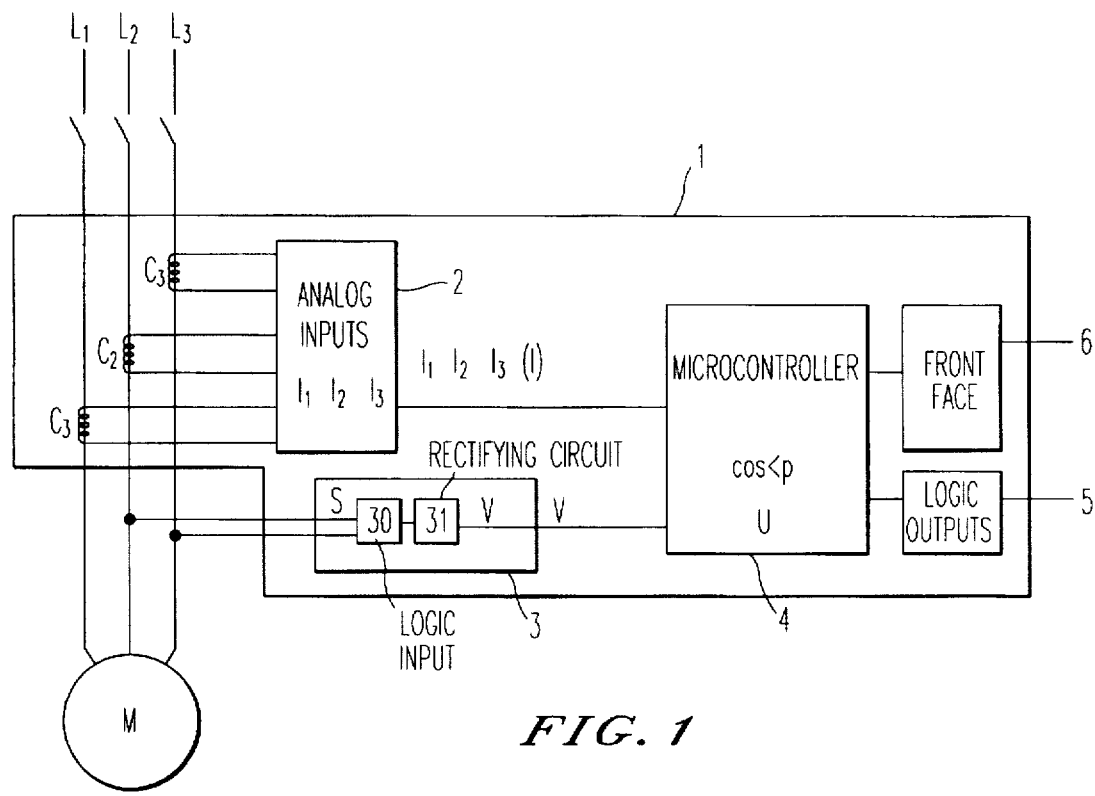
FIG. 1 is a diagram of the protective relay according to the invention.

The electronic relay 1, illustrated in FIG. 1, is intended to be connected to a multiphase electric load such as a three phase motor M powered by a line L1, L2, L3. The relay includes current sensors of the current transformer type marked C1, C2 and C3 arranged respectively on phase wires L1, L2 and L3. These transformers are known sensors and are commonly used for current measurements.

The relay has, on the one hand, analog inputs 2 which receive alternating signals I1, I2 and I3 of the phase currents supplied by the transformers C1, C2 and C3, and on the other hand, logic inputs 3. The logic input 30 receives an alternating signal S that represents the power supply voltage to the motor taken on two phase wires.

The logic input 30 is connected to a threshold voltage rectifying circuit 31, of a known type, that filters the alternating signal of voltage S and supplies a square wave rectified signal V.

The phase current signals I1, I2 and I3 and the rectified voltage signal V are sent to an electronic circuit 4 inside the relay and fitted with a microcontroller.

The electronic circuit 4 includes processing means capable of calculating, from information received, for each of the phases L1, L2 and L3, the phase shift φ of the signal I1, I2 and I3 corresponding with the signal V. Within the hypothesis where the motor is a balanced load, calculation of the phase shift φ can be carried out on one phase alone.

Figure 2:
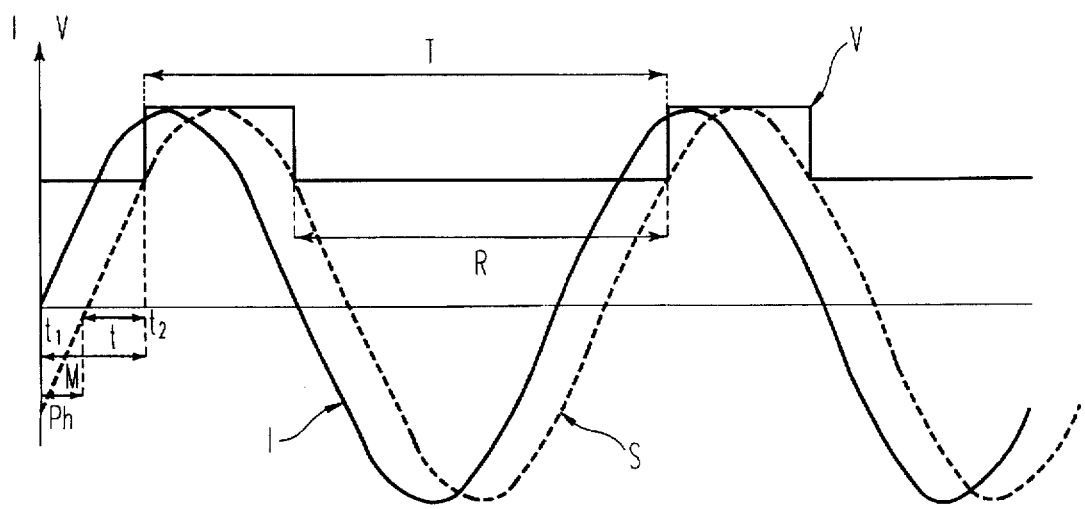
FIG. 2 is a diagram relating to the power supply voltage to the motor and the current consumed by it.

FIG. 2 shows the alternating sinusoidal current signal I of one phase of the line, such as the signal II and the square wave rectified signal V of the alternating voltage signal S illustrated by a dotted line. The voltage signal V is made up of simple square waves passing periodically from a voltage minimum, referred to as condition 0, to a voltage maximum referred to as condition 1. The signals permit determination of the lag Ph between the current and the voltage.

One way of calculating the phase shift φ and the voltage absorbed is given, as an example, below.

The processing means of circuit 4 assess, from the current signal I and the voltage signal V, the period T of the voltage signal V, the time R during which the voltage signal V is at condition 0 and the time M that passes between the instant t1 at which the current signal passes through the zero intensity value and the instant t2 at which the voltage signal V passes from condition 0 to condition 1.

Referring to FIG. 2, the lag Ph may be expressed as $$Ph = M - t$$

where t is the time that passes between the instant the voltage signal S passes through zero and the instant the rectified voltage signal V passes from condition 0 to condition 1.

The time t is calculated from the values of T and R determined according to the following formula $$2 \times t = (T/2) - (T - R)$$

which may also be written $$t = \frac{2R - T}{4}$$

Hence the lag Ph may be expressed as $$Ph = M - t = M - \frac{2R - T}{4}$$

The lag Ph represents a dephasing φ which, when expressed in degrees, may be written $$\phi = \left(\frac{Ph}{T/4}\right) \times 90$$

The assessed phase shift φ is compared with phase shift values in degrees recorded in a table inside circuit 4, defining a correlation between phase shift values and the associated cosine values.

The angle value closest to φ is used to determine the cosine φ or the value of the power factor of the motor corresponding to the phase shift between the voltage supplying the motor and the current consumed by it.

The electronic circuit 4 is also able to calculate the value of the power supply voltage to the motor U. The processing means of circuit 4 calculate a voltage coefficient K which depends on the period T and the time R of the voltage signal V.

The coefficient K is representative of the amplitude of the voltage signal and increases with it. For information only, this coefficient K can be calculated by $$K = \frac{R - T}{T}$$

The value of the voltage U is, for example, determined by comparing the assessed value of the coefficient K with the coefficient values recorded in a table inside circuit 4 defining a correlation between values for the coefficient and associated voltage values.

As an alternative, the power supply voltage U could be calculated in another way. For a scale of voltage values, going preferably from 100 Volts to 250 Volts, the voltage U may be written as a function of the director coefficient K in the form of the following refining equation:

$$U = A + (B \times K),$$

where A and B are constants pre-recorded in the circuit.

The voltage U can then be calculated from this equation by substituting into it the value of coefficient K assessed by the processing means of circuit 4.

The values of the power factor cosφ and the power supply voltage U are intended to be compared to previously established threshold values, below which the electronic circuit 4 is capable of giving a triggering command to the logic circuits 5, for example, to stop the motor and to transmit information relating to the power factor and the power supply voltage to an automatic control or to a display component 6 arranged on the front face of the relay.

Hence the invention allows the relay's logic inputs to be used to calculate values of the power factor and the power supply voltage from characteristics linked to the period of an image signal of the power supply voltage, without the need for voltage measurement transformers. Moreover, it should be noted that the calculation of the voltage value is carried out without needing to know the frequency of the power supply voltage signal which is generally equal to 50 or 60 Hz.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electronic relay for a multiphase electric load, said electronic relay comprising:

a plurality of sensor devices that supply a phase current for each phase;

a threshold voltage rectifying circuit that receives an alternating supply signal and outputs a rectified signal having a period, a minimum voltage condition, and a maximum voltage condition; and a microcontroller circuit that calculates a power factor or a power supply voltage that is a function of at least one of the phase currents and the period of the rectified signal.

2. The electronic relay according to claim 1, wherein the microcontroller circuit calculates the period of the rectified signal and the time during which the rectified signal is in a minimum voltage condition.

3. The electronic relay according to claim 2, wherein the microcontroller circuit calculates the time passing between an instant at which the at least one of the phase currents passes through zero intensity and an instant at which the rectified signal passes from the minimum voltage condition to the maximum voltage condition and the phase shift between the at least one of the phase currents and the alternating supply signal, said phase shift between the at least one of the phase currents and the alternating supply signal is a function of the time passing between the instant at which the at least one of the phase currents passes through zero intensity and the instant at which the rectified signal passes from the minimum voltage condition to the maximum voltage condition, the period of the rectified signal, and the time during which the rectified signal is in the minimum voltage condition.

4. The electronic relay according to claim 3, wherein the microcontroller circuit calculates the power factor from the phase shift between the at least one of the phase currents and the alternating supply signal and a table defining a correlation between phase shift values and associated cosine values.

5. An electronic relay circuit according to claim 2, wherein the microcontroller circuit calculates the power supply voltage from a voltage coefficient that is a function of the period of the rectified signal and the time during which the rectified signal is in the minimum voltage condition.

6. The electronic relay circuit according to claim 5, wherein the power supply voltage is also calculated from a table of values defining a correlation between voltage coefficient values and associated voltage values.

7. The electronic relay according to claim 5, wherein the power supply voltage is represented by a refining function having a director coefficient equal to the voltage coefficient.

* * * * *